(12) United States Patent
Adachi et al.

(10) Patent No.: US 6,590,268 B2
(45) Date of Patent: Jul. 8, 2003

(54) MAGNETIC CONTROL DEVICE, AND MAGNETIC COMPONENT AND MEMORY APPARATUS USING THE SAME

(75) Inventors: Hideaki Adachi, Osaka (JP); Akihiro Odagawa, Osaka (JP); Masayoshi Hiramoto, Nara (JP); Nozomu Matsukawa, Nara (JP); Hiroshi Sakakima, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 21 days.

(21) Appl. No.: 09/803,571

(22) Filed: Mar. 9, 2001

(65) Prior Publication Data

US 2001/0026466 A1 Oct. 4, 2001

(30) Foreign Application Priority Data

Mar. 14, 2000 (JP) ........................................ 2000-070393

(51) Int. Cl.[7] .............................................. H01L 43/00
(52) U.S. Cl. ........................ 257/421; 257/295; 257/410; 257/422; 365/145; 365/171; 365/173; 365/226
(58) Field of Search ........................ 257/108, 421–423, 257/295, 410, 36–39; 438/48, 54; 365/97, 117, 121, 145, 153, 157, 158, 171, 173, 226

(56) References Cited

U.S. PATENT DOCUMENTS

| | | | | | |
|---|---|---|---|---|---|
| 5,390,061 | A | * | 2/1995 | Nakatani et al. | 360/324.2 |
| 5,418,389 | A | * | 5/1995 | Watanabe | 257/295 |
| 6,215,695 | B1 | * | 4/2001 | Ikeda | 365/158 |
| 6,313,973 | B1 | * | 11/2001 | Fuke et al. | 360/324.1 |
| 6,395,388 | B1 | * | 5/2002 | Iwasaki et al. | 324/252 |

FOREIGN PATENT DOCUMENTS

| | | |
|---|---|---|
| EP | 0 864 538 A1 | 9/1998 |
| JP | 64-48295 | 2/1989 |
| JP | 3-189988 | 8/1991 |
| JP | 4-6697 | 1/1992 |
| JP | 10-284765 | 10/1998 |
| JP | 2000-187816 | 7/2000 |
| WO | WO 98/25263 | 6/1998 |

OTHER PUBLICATIONS

Rao et al. "Electric–Field–Induced Melting of the Randomly Pinned Charge–Ordered States of Rare–Earth Manganates and Associated Effects." *The American Physical Society, vol. 61, No. 1.* Jan. 1, 2000.

* cited by examiner

Primary Examiner—David Nelms
Assistant Examiner—Long Tran
(74) Attorney, Agent, or Firm—Merchant & Gould P.C.

(57) ABSTRACT

A magnetic control device including an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode. In particular, when an additional magnetic layer is further laminated on the magnetic layer placed in contact with the antiferromagnetic layer via a non-magnetic layer, the direction of the magnetization of the controlled magnetic layer can be detected as a change in the electric resistance. Since such a magnetic control device, in principle, responds to the electric field or magnetic field, it forms a magnetic component capable of detecting an electric signal or a magnetic signal. In this case, the direction of the magnetization basically is maintained until the next signal is detected, so that such a device also can form an apparatus. Thus, a magnetic control device capable of controlling the magnetization with voltage and magnetic component and a memory apparatus using the same are provided.

20 Claims, 5 Drawing Sheets

External magnetic field

MAGNETIC CONTROL DEVICE, AND MAGNETIC COMPONENT AND MEMORY APPARATUS USING THE SAME

FIELD OF THE INVENTION

The present invention relates to a magnetic control device capable of controlling magnetic properties with an external voltage, a magnetic component and a memory apparatus capable of detecting and storing an electric signal or a magnetic signal by using the above-mentioned control device.

BACKGROUND OF THE INVENTION

In recent years, with a development in the information related industry, a semiconductor memory has advanced remarkably. As a next generation memory, various types of MRAMs (Magnetoresistive Random Access Memories) capable of storing data with controlling the magnetization of a magnetic material have been researched (Journal of Japan Society of Applied Magnetics, Vol. 23, No. 7, p.1826 (1999)). In principle, in the MRAM, data are recorded while controlling the direction of the magnetization of a magnetic material in a magnetic field where current signals are generated, and then the inversion of the magnetization is read out by the use of the magnetoresistance effect. This is expected to be a next generation memory apparatus that is a nonvolatile type, responds at high speed and is also capable of high integration.

However, in the MRAM having the above-mentioned principle, some amount of current is needed in order to generate a magnetic field where the inversion of the magnetization is controlled, and therefore, it has a limitation in terms of saving electric power consumption. Furthermore, the degree of integration is increased, and it is getting difficult to have a configuration and a layout of a wiring so that a magnetic field is generated in only a particular device. In other words, in the magnetic control device writing data based on the current signal or MRAM using such a device, there is a limitation in lowering the consumption of electric power or increasing the integration degree.

SUMMARY OF THE INVENTION

It is an object of the present invention to provide a magnetic control device capable of controlling the magnetization with voltage, and a magnetic component and a memory apparatus using the same.

To achieve the above-mentioned object, a magnetic control device according to the present invention includes an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode.

Furthermore, a magnetic component according to the present invention detects an electric signal or a magnetic signal by using a magnetic control device, the magnetic control device including an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode.

Furthermore, a memory apparatus according to the present invention stores an electric signal or a magnetic signal by using a magnetic control device, the magnetic control device including an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode.

According to the present invention, a device capable of controlling the direction of the magnetization of the magnetic layer with a voltage signal can be achieved, and the use of the device provides a memory apparatus and a magnetoresistance effect magnetic component that operates with a low consumption power and that has a high integration density.

DETAILED DESCRIPTION OF THE INVENTION

Figure 1:
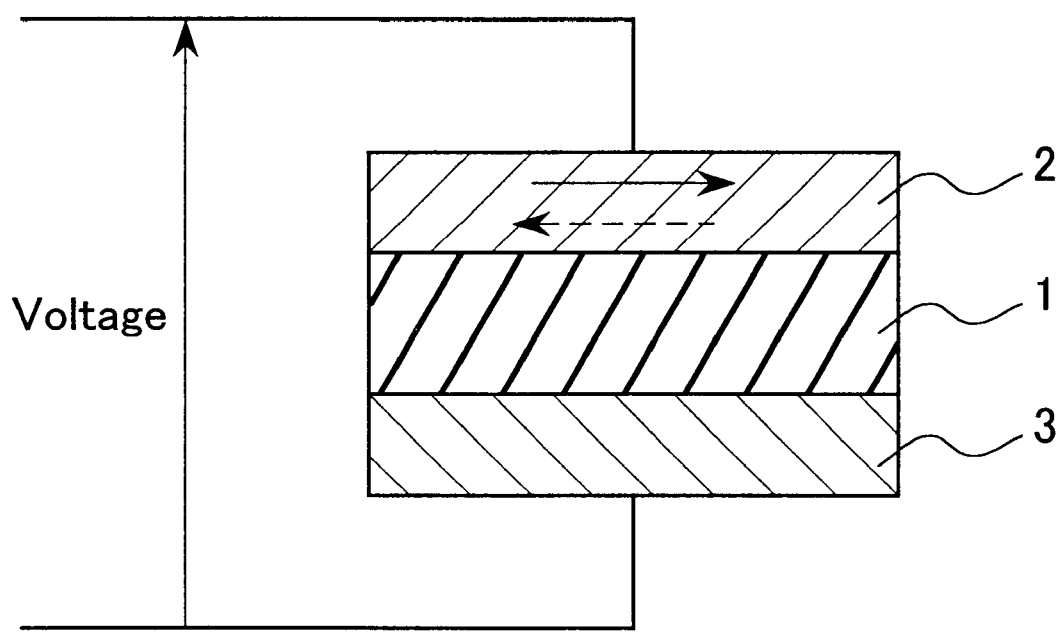
FIG. 1 is a schematic cross-sectional view showing a magnetic control device according to one embodiment of the present invention.

Unlike a conventional magnetization control by the use of current, according to the present invention, in a device including an antiferromagnetic layer, a magnetic layer placed in contact with one side of the antiferromagnetic layer, and an electrode placed in contact with another side of the antiferromagnetic layer, an electric field is applied to the antiferromagnetic layer by applying voltage between the magnetic layer and the electrode so as to control the magnetization of the magnetic layers that are in contact with the antiferromagnetic layer.

In particular, it is preferable that when an additional magnetic layer is laminated on the magnetic layer placed in contact with the antiferromagnetic layer via a non-magnetic layer, the direction of the magnetization of the controlled magnetic layer is detected as a change of the electric resistance by the magnetoresistance effect.

Furthermore, such a magnetic control device can form a magnetic component detecting an electric signal or a magnetic signal, because it, in principle, responds to the electric field or the magnetic field. In this case, the direction of the magnetization of the magnetic material basically is stored until the next signal is detected, the magnetic control device also can form a memory apparatus.

According to the present invention, it is preferable that an additional magnetic layer further is laminated on the magnetic layer placed in contact with the antiferromagnetic layer via a non-magnetic layer. This is preferable because the electric resistance is changed depending upon the connecting condition in the magnetic direction of the magnetic layers disposed on the both sides of the non-magnetic layer (magnetoresistance effect), so that the direction of the magnetization of the magnetic layer controlled with the voltage can be detected easily.

It is preferable that further a magnetization spinning suppression layer is laminated on the laminate structure of magnetic layer/non-magnetic layer/magnetic layer placed in contact with the antiferromagnetic layer to fix the magnetization of the magnetic layer. This is preferable because the direction of the magnetization of the magnetic layer placed in contact with the magnetization spinning suppression layer is fixed, so that it is possible to read out reliably the direction of the magnetic layer placed in contact with the controlled antiferromagnetic layer. It is preferable that the magnetization spinning suppression layer is formed of a P—Mn based alloy (P is at least one element selected from the group consisting of Pt, Ni, Pd, Ir, Rh, Ru and Cr). Furthermore, it is preferable that the specific resistance of the antiferromagnetic layer is 1 Ωcm or more. The use of a material of 1 Ωcm or more permits controlling the magnetization. A more preferable specific resistance is 1 kΩcm or more.

It is preferable that the antiferromagnetic layer is formed of an oxide. The use of an oxide permits control of the magnetization. An example of the oxide includes $Cr_2O_3$, $Ti_2O_3$, $Nb_2Mn_4O_9$, $Ta_2Mn_4O_9$, $Nb_2Co_4O_9$, $Ta_2Co_4O_9$, $GaFeO_3$, $Ni_3B_7O_{13}I$, $FeSb_2O_4$, $MnNb_2O_6$, $MnGeO_3$, $LiMnPO_4$, $LiFePO_4$, $LiCoPO_4$, $LiNiPO_4$, $GdAlO_3$, $DyAlO_3$, $TbAlO_3$, $DyPO_4$, $Fe_2TeO_6$, $BaCoF_4$, $BaMnF_4$, $CoF_2$, $NnF_2$, $\alpha\ Fe_2O_3$, and the like. Above all, an oxide including iron is preferable. Furthermore, the antiferromagnetic layer may be formed of an oxide containing iron and at least one element selected from the group consisting of a rare earth element, bismuth and gallium. Furthermore, the antiferromagnetic layer is formed of an oxide having a perovskite structure or a perovskite related structure. The oxide having a perovskite related structure herein denotes a compound having the same crystal structure as the perovskite structure.

It is preferable that the antiferromagnetic layer is formed of an oxide having an epitaxially grown perovskite structure or a perovskite related structure.

It is preferable that the antiferromagnetic layer formed of an oxide having an epitaxially grown perovskite structure or a perovskite related structure is a layer including a plane corresponding to the (110) plane of a perovskite unit lattice.

It is preferable that the antiferromagnetic layer has a weak magnetism of 500 gauss or less, caused by ferromagnetism or parasitic ferromagnetism.

It is preferable that a thickness of the magnetic layer placed in contact with the antiferromagnetic layer is 100 nm or less. A more preferable thickness is 1 to 20 nm.

It is preferable that the magnetic layer is formed of at least one element selected from the group consisting of iron, cobalt and nickel.

Hereinafter, a magnetic control device, a magnetic component and a memory apparatus using the same of the present invention will be described with reference to drawings.

FIG. 1 is one example of a cross-sectional view showing a configuration of a magnetic control device of the present invention. An antiferromagnetic layer 1 is sandwiched between a magnetic layer 2 and a metal electrode 3. The present inventors found that the direction of the magnetization of the magnetic layer 2 can be controlled by allowing the electric field to be generated within the antiferromagnetic material by applying voltage between the electrode 3 and the magnetic layer 2. A phenomenon in which the magnetization or a magnetic zone of the material is effected by the applied electric field is known as an ME effect (magnetoelectric effect), but the amount of the magnetization to be controlled was not so large. According to a conventional principle, the fact that the magnetic direction of the magnetic layers placed in contact with the antiferromagnetic layer can be controlled could not be anticipated. A mechanism in which by applying the electric field to the antiferromagnetic layer, the magnetization of the neighboring magnetic layers is changed is not known. One possible reason is that the lattice distortion with respect to the exchange bonding between the antiferromagnetic layer and the magnetic layer is involved.

Figure 2:
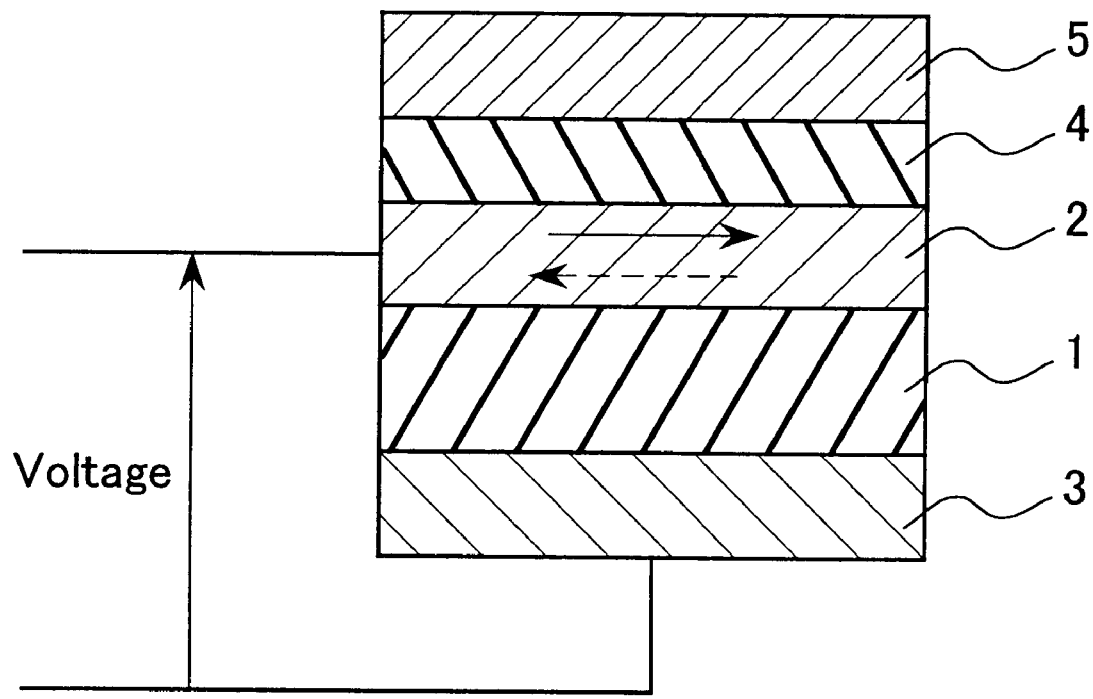
FIG. 2 is a schematic cross-sectional view showing a magnetic control device according to one embodiment of the present invention.

In this case, there are various methods for detecting the direction of the magnetization. As shown in FIG. 2, when, in particular, a laminate structure of magnetic layer 2/non-magnetic layer 4/magnetic layer 5 is further laminated in addition to a magnetic layer 2, since the electrical resistance is changed depending upon the bonding condition in the direction of the magnetization of the magnetic layers deposited on the both surfaces of the non-magnetic layer (magnetoresistance effect), it is possible to detect the direction of the magnetization of the magnetic layer controlled by voltage.

Figure 3:
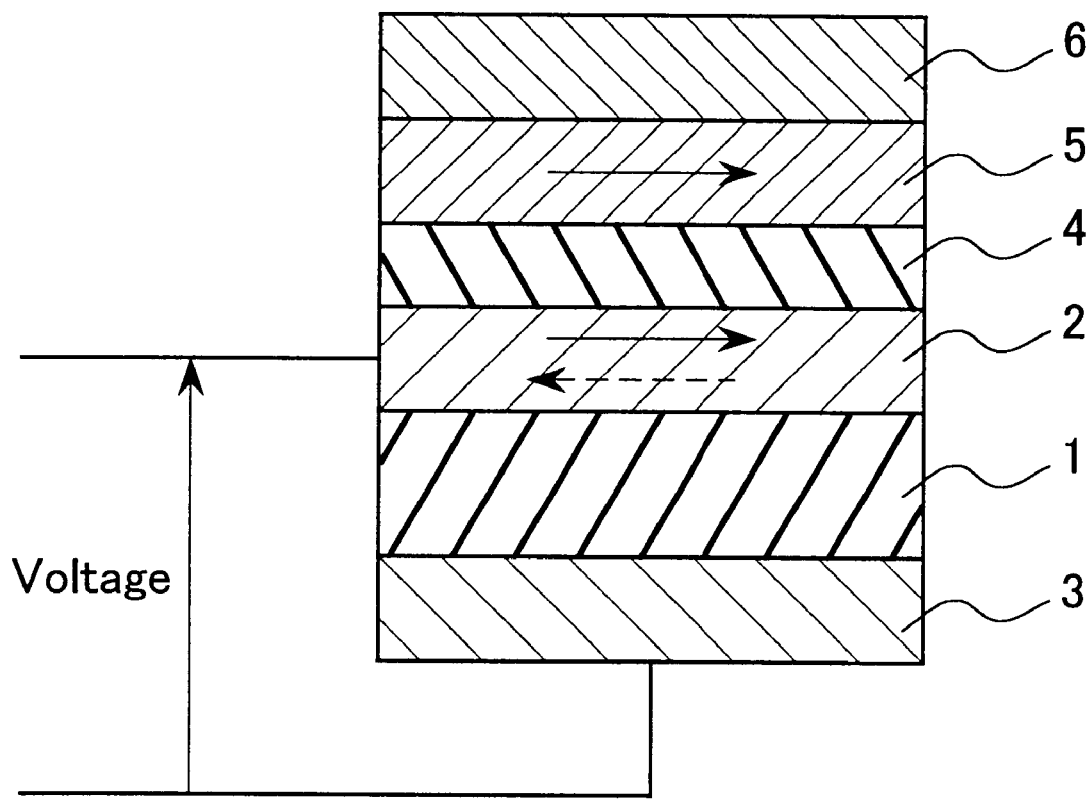
FIG. 3 is a schematic cross-sectional view showing a magnetic control device according to one embodiment of the present invention.

Furthermore, as shown in FIG. 3, when a magnetization spinning suppression layer 6 is further laminated onto the laminate of magnetic layer 2/non-magnetic layer 4/magnetic layer 5, the direction of the magnetization of the magnetic layer 5 is fixed, so that it is possible to read out the direction of the controlled magnetic layer 2. It is confirmed that a suitable material for the magnetization spinning suppression layer 6 is a P—Mn based alloy (P is at least one element selected from the group consisting of Pt, Ni, Pd, Ir, Rh, Ru and Cr). The preferable composition ratio of P:Mn is 70–30:30–70 atomic %.

The magnitude of electric field necessary for controlling the magnetization differs depending upon the materials of the ferromagnetic layer. However, it is found that even if the material has a small magnetization control effect, if a high electric field of 100 kV/cm or more is applied, the magnetization can be controlled. In this case, however, the change of the magnetization that is not dependent upon the direction in which the electric field is applied is shown. On the other hand, when the antiferromagnetic layer having a material of a large magnetization control effect is used, an electric field of about 10 kV/cm permits control of the magnetization. Furthermore, it also was found that the directions of the magnetization of the magnetic layer were reversed in accordance with the positive or negative status of the voltage. The upper limit value is not particularly limited, but practically the magnitude of the electric field is preferably $10^4$ kV/cm or less.

In this case, when the material having a specific resistance of the antiferromagnetic layer of 1 Ωcm or more is used, the effect of controlling the magnetization can be obtained. Furthermore, it was found that when the specific resistance of the material of the antiferromagnetic layer is 100 Ωcm or more, a greater effect for controlling the magnetization could be obtained. The upper limit value is not particularly limited, but practically the specific resistance is preferably 1 kΩcm or less.

When an oxide is used as a material for the antiferromagnetic layer, a large effect of controlling the magnetization can be obtained. In particular, an oxide including manganese, cobalt, or nickel can provide a great effect of controlling the magnetization. More preferably, it was found that a high magnetic control effect could be obtained, when an oxide included iron. Furthermore, when an oxide includes iron and at least one selected from the group consisting of a rare earth element, bismuth and gallium, the magnetization can be controlled remarkably. The crystal structure of the antiferromagnetic layer is too complicated to determine exactly, but it is thought to be a lattice structure of a perovskite structure or a perovskite related structure according to an X-ray analysis. When this perovskite structure epitaxially grows to have crystals that are oriented in one direction, an effect of controlling the magnetization is larger than the case of the poly crystal structure. The more preferable result was obtained when the (110) plane of the perovskite unit lattice appears as a crystal plane of the antiferromagnetic layer. In addition, although the reason is not clear, in the antiferromagnetic layer, when the magnetism in the opposite direction and parallel direction are not perfectly offset with each other and a weak magnetism caused by ferromagnetism or parasitic ferromagnetism is 500 gauss or less, a larger effect of controlling the magnet layer can be obtained.

A thickness of the magnetic layer placed in contact with the antiferromagnetic layer, which is subjected to the magnetization control, could be up to about 100 nm. Particularly preferably, when the thickness is in the range from 1 nm to 20 nm, the magnetization of the magnetic layer can be controlled almost perfectly. As a material for the magnetic layer, any materials may be used as long as they exhibit a magnetism. In particular, it is preferable that the magnetic layer is formed of a metal film of one or two or more of elements selected from iron, cobalt, nickel, so that a smooth layer can be obtained.

Figure 4A:
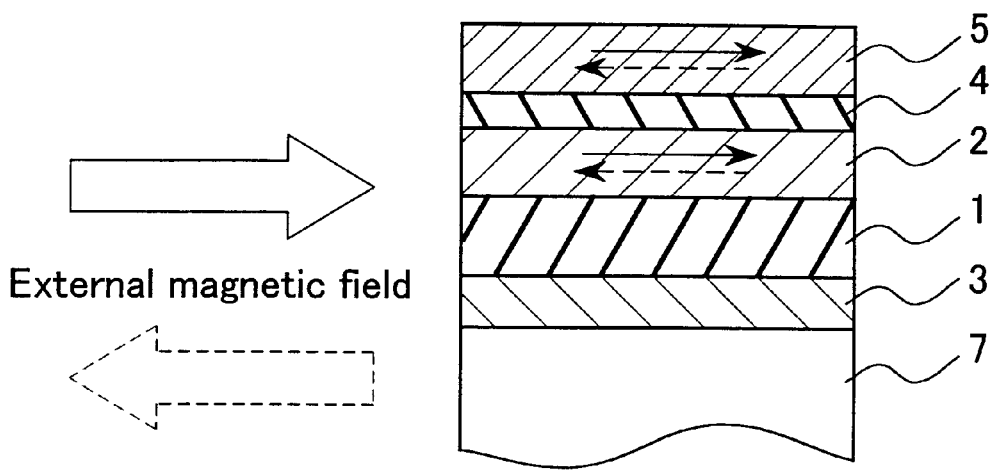
FIGS. 4A and 4B are schematic cross-sectional views showing an example of a magnetic component according to one embodiment of the present invention.
Figure 4B:
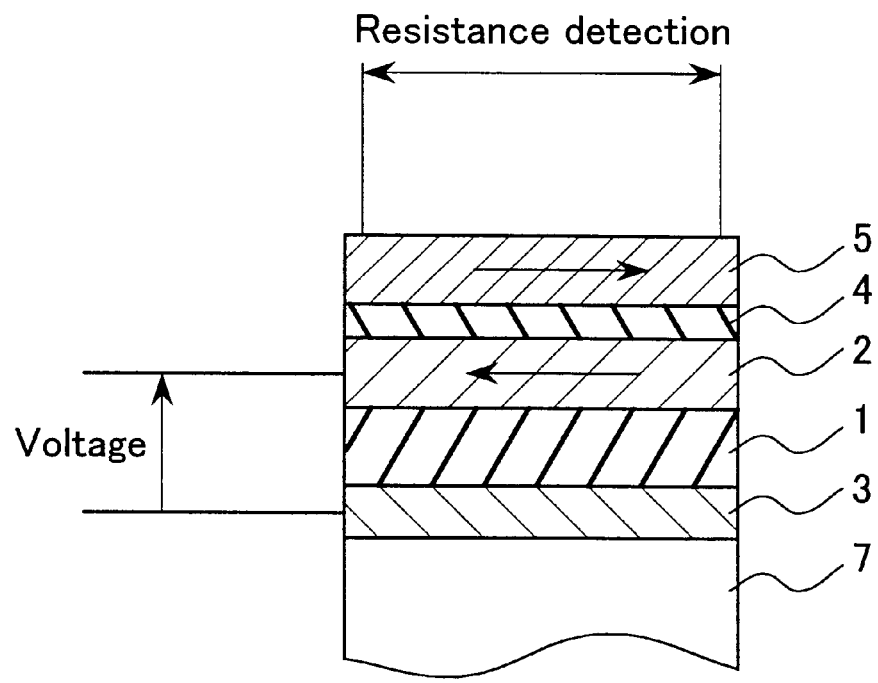

It is possible to form a magnetic component using the magnetic control device of the present invention mentioned above. Schematic cross-sectional views shown in FIGS. 4A to 4B are examples of the configuration of the magnetic component reading out the change of the magnetic field and detecting the magnetic signals. A metal electrode 3, an antiferromagnetic layer 1, a magnetic layer 2, a conductive non-magnetic layer 4 and a magnetic layer 5 are laminated on a substrate 7 (as a substrate, an inorganic substance such as glass, silicone, sapphire, monocrystalline perovskite, etc, preferably are used). In this case, the magnetization of the magnetic layer is not fixed, so that the direction of the magnetization is changed easily by an external magnetic field. As shown in FIG. 4A, when the external magnetic field of the magnetic signal is applied to the magnetic component, the directions of the magnetization of the magnetic layers 2 and 5 are stored toward the external magnetic field. In order to read out the signal, as shown in FIG. 4B, voltage is applied to the antiferromagnetic layer of the element to be read out and controls the direction of the magnetization of the magnetic layer 2, thereby detecting the change in the electric resistance by the magnetoresistance effect. In the case where the direction of the magnetic field signal is the same as that of the controlled magnetic layer 2, the both magnetic layers have the same magnetization direction. In this case, spins of conductive electron are suppressed from scattering on the interface between the magnetic layer and the conductive non-magnetic layer and the resistance is lowered. On the other hand, when the direction of the magnetic field signal is different from that of the magnetic layer 2, the magnetic component in which the resistance is increased due to the spin scattering is formed.

Figure 5:
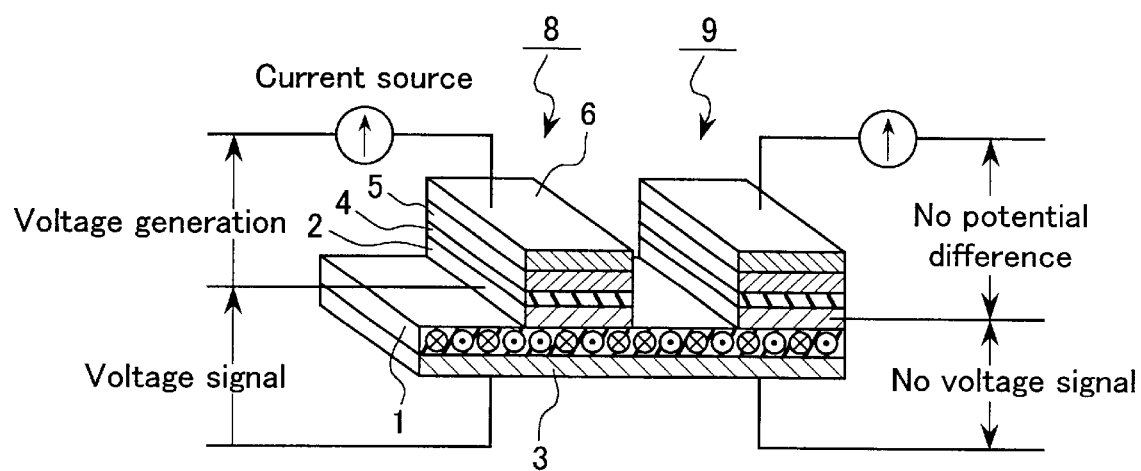
FIG. 5 are schematic cross-sectional view showing an example of a memory apparatus according to one embodiment of the present invention.

FIG. 5 shows an example of the magnetic memory apparatus composed of the magnetic control device of the present invention. Two memory cells 8 and 9 are shown. Each memory cell is formed of a laminate structure composed of a metal electrode 3, an antiferromagnetic layer 1, a magnetic layer 2, a non-magnetic layer 4, a magnetic layer 5, and a magnetization spinning suppression layer 6. The direction of the magnetization of the magnetic layer itself is controlled in accordance with or without the voltage applied between the metal electrode and the magnetic layer, and thus an electric signal is stored. As shown in FIG. 5, when a voltage signal pulse is input between the magnetic layer 2 and the electrode 3 of the memory cell 8, the direction of spins in a part of the antiferromagnetic layer 1 where the electric field is applied is reversed, so that the direction of the magnetization of the magnetic layer 2 is controlled due to the exchange bonding, etc. For example, in a case where no voltage signal is generated, as shown in the memory cell 9, the direction of magnetic layer 2 and magnetic layer 5 are allowed to be oriented in one direction, since electrons can pass through between the magnetic layers without scattering, no electric potential is generated. On the other hand, in the memory cell 8, voltage is generated due to the spin scattering. Therefore, it is possible to form a memory apparatus capable of storing and reading out the voltage signals.

EXAMPLES

Hereinafter, the present invention will be described specifically by way of examples.

Example 1

A platinum electrode film was deposited to a thickness of 50 nm on a silicone substrate provided with an oxide film, which had been heated to about 250° C. by a sputtering evaporation method, then a $(Ga_{0.95}, Y_{0.05})FeO_3$ layer (numerical values given to Ga and Y represent the atomic ratio, and the same is true hereinafter) was deposited to a thickness of 300 nm as an antiferromagnetic layer, and finally, a Co magnetic film was deposited to a thickness of 5 nm. Thus, as shown in FIG. 1, a laminate film composed of a platinum electrode 3, a $(Ga_{0.95}, Y_{0.05})FeO_3$ antiferromagnetic layer 1 and a Co magnetic film 2 was formed. By applying 3V of voltage between the Co magnetic layer and the platinum electrode, a magnetization curve corresponding to 20 oersted of external magnetic field was shifted, showing that the direction of the magnetization of the magnetic layer was controlled.

Example 2

A magnetic control device shown in FIG. 2 was formed of a Nb-added $SrTiO_3$ conductive substrate electrode 3, a $(Bi_{0.9}, Y_{0.1})FeO_3$ antiferromagnetic layer 1, a Co magnetic layer 2, a Cu non-magnetic layer 4, and a CoFe magnetic layer. As plane directions of the Nb-added $SrTiO_3$ conductive monocrystal electrode to be used for the substrate, three kinds, i.e. (100), (110) and (111) planes were used. First, a thin $(Bi_{0.9}, Y_{0.1})FeO_3$ antiferromagnetic film was deposited to a thickness of 70 nm on the substrate that had been heated to about 650° C. by a sputtering method, and then layers of Co/Cu/CoFe were laminated to thicknesses of 2 nm/2 nm/5 nm at room temperature. In this case, the $(Bi_{0.9}, Y_{0.1})FeO_3$ antiferromagnetic layer had a perovskite structure that had been grown epitaxially with each plane direction maintained.

The magnetic component shown in FIG. 4 was formed by providing the electrode and the magnetic layer with electric wires. When 100 oersted of magnetic field pulse was applied to the substrate surface in a direction parallel to the surface, then 2V of voltage was applied between the conductive substrate electrode 3 and the Co magnetic layer 2 to detect an in-plane resistance of the CoFe magnetic layer 5, and the change in the electric resistance was observed depending upon the presence or absence of the magnetic field pulse. When the magnetic field signal was detected, the change of the resistance was increased by 3% or more in each plane direction of the $SrTiO_3$ substrate. In particular, when a $SrTiO_3$ (110) plane was used, a great change of 8% or more was observed. This is thought to be because the orientation of spins of the antiferromagnetic layer that had been grown epitaxially was involved. The maximum change of the resistance was obtained when the device was formed by using the $SrTiO_3$ (110) monocrystal substrate, and a magnetic field was applied to a <001> direction of the substrate. At that time, it was confirmed in the devices that the resistance was increased by about 15%.

As mentioned above, it was possible to realize a magnetic component capable of detecting the magnetic signal of the device. It was possible to detect the magnetic field signal by arranging a large number of the devices and by applying the voltage to the devices where the magnetic field signal were intended to be read out. Needless to say, a magnetic component capable of detecting the electric signals applied to the antiferromagnetic layer 1 can be formed by the same configuration.

Example 3

A device having the same configuration as in Example 2 was formed by using a perovskite type $Pb(Fe_{0.5}, Nb_{0.5})O_3$ antiferromagnetic layer. This antiferromagnetic layer had a weak magnetic property of about 100 gauss, caused by parasitic ferromagnetism. The device using this layer had an excellent property of 18% resistance change. As the antiferromagnetic layer, various kinds of thin film layers were made by using the other compositions, for example, $Pb(Co_{0.5}, W_{0.5})O_3$, $Pb(Mn_{0.5}, Nb_{0.5})O_3$, or by using the other forming conditions, and the obtained antiferromagnetic layers having different properties were investigated. As a result, when the antiferromagnetic layer had a weak magnetism which was equal to or not more than 500 gauss or less, a large resistance change tended to be obtained. This is thought to be because the mechanism of magnetic control of the device was effected by the weak magnetism of the antiferromagnetic layer, however, the detailed reason is not known.

Example 4

A magnetic control device having a configuration shown in FIG. 3 was formed of a 50 nm thick platinum electrode 3, a 100 nm thick $(Bi_{0.9}, Ti_{0.1})FeO_3$ antiferromagnetic layer 1, a 2 nm thick CoFe magnetic layer 2, 1 nm thick $Al_2O_3$ non-magnetic layer 4, 5 nm thick NiFe magnetic layer 5, and a 2 nm PtMn magnetization spinning suppression layer 6. In this case, the $Al_2O_3$ non-magnetic layer is an electrical insulator, in which electric current in the vertical direction is effected by the spin tunneling that depends upon the direction of the magnetization of the magnetic layers disposed on the both surfaces. Namely, by the tunnel magnetoresistance effect, when the directions of the magnetization on both sides of the magnetic layer were the same, the resistance was low, and when the direction was not in parallel, high resistance was shown. A platinum layer, a $(Bi_{0.9}, Ti_{0.1})FeO_3$ antiferromagnetic layer, and a CoFe layer were laminated on a sapphire c-plane substrate, and then a 0.7 nm aluminum layer was deposited thereon with natural oxidation in an atmosphere of oxygen to thus form an $Al_2O_3$ layer. Thereafter, a NiFe magnetic layer and a PtMn magnetization spinning suppression layer were deposited. This laminate film was divided into cells by a fine work. Thus, as shown in FIG. 5, a memory apparatus having a plurality of memory cells was produced. Depending upon the presence or absence of an electric signal, the direction of the magnetization of the CoFe magnetic layer 2 of each cell was controlled and stored, which was read out as a change of the resistance with respect to an electric current in the vertical direction of the cell. In the case of this device, since the tunneling magnetoresistance effect was used, it was possible to form a memory apparatus showing a large resistance change of 30% depending upon the presence or absence of the electric signal.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetic control device comprising an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode,
   wherein the voltage applied between the magnetic layer and the electrode is 10 kV/cm or more.

2. The magnetic control device according to claim 1, wherein a magnetic layer is further laminated on the magnetic layer placed in contact with the antiferromagnetic layer via a non-magnetic layer.

3. The magnetic control device according to claim 2, wherein a magnetization spinning suppression layer is further laminated on the laminate structure of magnetic layer/non-magnetic layer/magnetic layer placed in contact with the antiferromagnetic layer to fix the magnetization of the magnetic layer.

4. The magnetic control device according to claim 3, wherein the magnetization spinning suppression layer is formed of a P—Mn based alloy, where P is at least one element selected from the group consisting of Pt, Ni, Pd, Ir, Rh, Ru and Cr.

5. The magnetic control device according to claim 1, wherein the specific resistance of the antiferromagnetic layer is 1 $\Omega$cm or more.

6. The magnetic control device according to claim 1, wherein the antiferromagnetic layer is formed of an oxide.

7. The magnetic control device according to claim 6, wherein the antiferromagnetic layer is formed of an oxide containing at least iron.

8. The magnetic control device according to claim 7, wherein the antiferromagnetic layer is formed of an oxide containing iron and at least one element selected from the group consisting of a rare earth element, bismuth and gallium.

9. The magnetic control device according to claim 1, wherein the antiferromagnetic layer is formed of an oxide having a perovskite structure or a perovskite related structure.

10. The magnetic control device according to claim 9, wherein the antiferromagnetic layer is formed of an oxide having an epitaxially grown perovskite structure or a perovskite related structure.

11. The magnetic control device according to claim 10, wherein the antiferromagnetic layer formed of an oxide of an epitaxially grown perovskite structure or a perovskite related structure is a layer including a plane corresponding to the (110) plane of a perovskite unit lattice.

12. The magnetic control device according to claim 1, wherein the antiferromagnetic layer has a weak magnetism of 500 gauss or less, caused by ferromagnetism or parasitic ferromagnetism.

13. The magnetic control device according to claim 1, wherein a thickness of the magnetic layer placed in contact with the antiferromagnetic layer is 100 nm or less.

14. The magnetic control device according to claim 1, wherein the magnetic layer is formed of at least one element selected from the group consisting of iron, cobalt and nickel.

15. A magnetic component detecting an electric signal or a magnetic signal by using a magnetic control device, the magnetic control device comprising an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode, wherein the voltage applied between the magnetic layer and the electrode is 10 kV/cm or more.

16. The component according to claim 15, wherein an additional a magnetic layer is further laminated on the magnetic layer placed in contact with the antiferromagnetic layer via a non-magnetic layer.

17. The component according to claim 16, wherein a magnetization spinning suppression layer is further laminated on the laminate structure of the magnetic layer/non-magnetic layer/magnetic layer placed in contact with the antiferromagnetic layer to fix the magnetization of the magnetic layer.

18. A memory apparatus storing an electric signal or a magnetic signal by using a magnetic control device, the magnetic control device comprising an antiferromagnetic layer, a magnetic layer placed in contact with one side of the antiferromagnetic layer, and an electrode placed in contact with another side of the antiferromagnetic layer, wherein the direction of the magnetization of the magnetic layer is controlled by voltage applied between the magnetic layer and the electrode, wherein the voltage applied between the magnetic layer and the electrode is 10 kV/cm or more.

19. The memory apparatus according to claim 18, wherein a magnetic layer is further laminated on the magnetic layer placed in contact with the antiferromagnetic layer via a non-magnetic layer.

20. The memory apparatus according to claim 19, wherein a magnetization spinning suppression layer is further laminated on the laminate structure of the magnetic layer/non-magnetic layer/magnetic layer placed in contact with the antiferromagnetic layer to fix the magnetization of the magnetic layer.

* * * * *

UNITED STATES PATENT AND TRADEMARK OFFICE
CERTIFICATE OF CORRECTION

PATENT NO.    : 6,590,268 B2
DATED         : July 8, 2003
INVENTOR(S)   : Adachi et al.

It is certified that error appears in the above-identified patent and that said Letters Patent is hereby corrected as shown below:

<u>Title page,</u>
Item [75], Inventors, "Odagawa, Osaka" should read -- Odagawa, Nara --

Signed and Sealed this

Second Day of March, 2004

JON W. DUDAS
*Acting Director of the United States Patent and Trademark Office*